(12) United States Patent
Chen

(10) Patent No.: US 11,374,064 B2
(45) Date of Patent: Jun. 28, 2022

(54) DISPLAY PANEL AND MANUFACTURING METHOD THEREOF, AND DISPLAY DEVICE

(71) Applicant: Wuhan China Star Optoelectronics Semiconductor Display Technology Co., Ltd., Wuhan (CN)

(72) Inventor: Zesheng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 127 days.

(21) Appl. No.: 16/769,256

(22) PCT Filed: Mar. 17, 2020

(86) PCT No.: PCT/CN2020/079575
§ 371 (c)(1),
(2) Date: Jun. 3, 2020

(87) PCT Pub. No.: WO2021/109357
PCT Pub. Date: Jun. 10, 2021

(65) Prior Publication Data
US 2021/0408133 A1    Dec. 30, 2021

(30) Foreign Application Priority Data
Dec. 4, 2019  (CN) .......................... 201911226455.4

(51) Int. Cl.
*G06F 3/041*    (2006.01)
*H01L 27/32*    (2006.01)
(Continued)

(52) U.S. Cl.
CPC .......... *H01L 27/322* (2013.01); *G06F 3/0412* (2013.01); *G06F 3/0443* (2019.05);
(Continued)

(58) Field of Classification Search
None
See application file for complete search history.

(56) References Cited

U.S. PATENT DOCUMENTS

2016/0372523 A1    12/2016 Ito et al.
2017/0090634 A1*   3/2017 Yang .................... G06F 3/0445
(Continued)

FOREIGN PATENT DOCUMENTS

CN    107204355     9/2017
CN    107359188    11/2017
(Continued)

*Primary Examiner* — Brian M Butcher

(57) ABSTRACT

The present invention provides a display panel and a manufacturing method thereof, and a display device. The display panel includes an array substrate, a light emitting device layer, and a packaging layer. The packaging layer includes a plurality of first openings and spacers disposed between adjacent first openings on a spacer layer. Any one of the first openings is filled with a color resist. A plurality of metal wires are disposed in the spacers, and the plurality of metal wires constitute a plurality of first electrodes arranged in a first direction and a plurality of second electrodes arranged in a second direction.

15 Claims, 5 Drawing Sheets

(51) Int. Cl.
*G06F 3/044* (2006.01)
*H01L 51/52* (2006.01)
*H01L 51/56* (2006.01)

(52) U.S. Cl.
CPC .......... *G06F 3/0446* (2019.05); *H01L 27/323* (2013.01); *H01L 27/3244* (2013.01); *H01L 51/5284* (2013.01); *H01L 51/56* (2013.01); *G06F 2203/04103* (2013.01); *G06F 2203/04111* (2013.01); *H01L 2227/323* (2013.01)

(56) References Cited

U.S. PATENT DOCUMENTS

2017/0220159 A1* 8/2017 Xu .................... G02F 1/133516
2017/0271429 A1   9/2017 Kim et al.
2019/0067397 A1   2/2019 Cho et al.
2020/0388792 A1  12/2020 Huang

FOREIGN PATENT DOCUMENTS

| CN | 109004004 | 12/2018 |
| CN | 110265568 | 9/2019 |

\* cited by examiner

DISPLAY PANEL AND MANUFACTURING METHOD THEREOF, AND DISPLAY DEVICE

RELATED APPLICATIONS

This application is a National Phase of PCT Patent Application No. PCT/CN2020/079575 having International filing date of Mar. 17, 2020, which claims the benefit of priority of Chinese Patent Application No. 201911226455.4 filed on Dec. 4, 2019. The contents of the above applications are all incorporated by reference as if fully set forth herein in their entirety.

FIELD AND BACKGROUND OF THE INVENTION

The present invention relates to the field of displays, and in particular, to a display panel, a manufacturing method thereof, and a display device.

In flat panel display technologies, organic light emitting diode (OLED) displays have many advantages, such as thinness, active light emission, fast response times, large viewing angles, wide color gamut, high brightness, and low power consumption, and have gradually become third-generation display technology following LCDs.

Current OLED display panels generally need to form a color film layer, a touch layer, etc. on a packaging layer. Processes of the packaging layer and the color film layer require multiple photomasks, and the touch layer can be built-in or plug-in, etc. The above structure and operation complicate processes of OLED display panels, and also increase a thickness of the panels.

Therefore, a display panel is urgently needed to solve the above technical problems.

SUMMARY OF THE INVENTION

The present invention provides a display panel and a manufacturing method thereof, and a display device, so as to solve complicated technical problems of current OLED display panel processes.

The present invention provides a manufacturing method of a display panel, comprising following steps of:

forming a light emitting device layer on an array substrate;

forming a spacer layer on the light emitting device layer;

forming a plurality of first openings defined in the spacer layer and spacers disposed between the adjacent first openings by using a first photomask process;

forming a color resist layer in the first opening, wherein the color resist layer comprises a plurality of color resists, and each of the first openings corresponds to one of the color resists; and forming a second light-shielding layer on the spacers and the color resist layer, and forming a plurality of second openings on the second light-shielding layer by using a second photomask process;

wherein an area of the second opening is less than an area of the first opening method for manufacturing a display panel.

In the manufacturing method of the display panel of the present invention, the step of forming the spacer layer on the light emitting device layer comprises:

forming a first insulating layer on the light emitting device layer;

forming a first metal layer on the first insulating layer;

forming a second insulating layer on the first metal layer;

forming a second metal layer on the second insulating layer; and forming a first light-shielding layer on the second metal layer.

In the manufacturing method of the display panel of the present invention, the step of forming the first metal layer on the first insulating layer comprises:

forming the first metal layer on the first insulating layer; and making the first metal layer to form a plurality of bridge wires disposed between the adjacent first openings by using a third photomask process;

wherein the step of forming the second metal layer on the second insulating layer further comprises:

forming a plurality of first via holes on the second insulating layer corresponding to the bridge wires, so that a portion of the bridge wires is exposed.

In the manufacturing method of the display panel of the present invention, the step of forming the plurality of first openings and the spacers disposed between the adjacent first openings on the spacer layer by using the first photomask process comprises:

forming a first light-shielding pattern by exposing and developing the first light-shielding layer; and etching the first insulating layer, the first metal layer, the second insulating layer, and the second metal layer according to the first light-shielding pattern, and making the second metal layer to form a plurality of metal wires;

wherein the plurality of metal wires constitutes a plurality of first electrodes arranged along a first direction and a plurality of second electrodes arranged along a second direction, and the first electrodes and the second electrodes are insulated and intersected with each other.

In the manufacturing method of the display panel of the present invention, before the step of forming the color resist layer in the first opening, the manufacturing method further comprises the step of:

forming a third insulating layer on an inner circle of any of the first openings.

The present invention further provides a display panel comprising an array substrate, a light emitting device layer disposed on the array substrate, and a packaging layer disposed on the light emitting device layer;

wherein the packaging layer comprises a plurality of first openings and spacers disposed between the adjacent first openings, and any one of the first openings is filled with a color resist; and wherein a plurality of metal wires is disposed in the spacers, the plurality of metal wires constitutes a plurality of first electrodes arranged along a first direction and a plurality of second electrodes arranged along a second direction, and the first electrodes and the second electrodes are insulated and intersected with each other.

In the display panel of the present invention, the spacer comprises a first insulating layer on the light emitting device layer, a first metal layer on the first insulating layer, a second insulating layer on the first metal layer, a second metal layer on the second insulating layer, and a first light-shielding layer on the second metal layer;

wherein a sum of thicknesses of the first insulating layer, the first metal layer, the second insulating layer, the second metal layer, and the first light-shielding layer is equal to a thickness of the color resist; and wherein two of the adjacent first electrodes disposed along the first direction or two of the adjacent second electrodes disposed along the second direction are electrically connected to the second metal layer through a first via hole.

In the display panel of the present invention, the light emitting device layer comprises a pixel region, and an orthographic projection of any of the color resists on the light emitting device layer covers the pixel region.

In the display panel of the present invention, the packaging layer further comprises a second light shielding layer disposed on the first light shielding layer;

the second light-shielding layer covers the first light-shielding layer and a portion of the first opening;

the second light-shielding layer comprises at least one second opening;

each of the second openings is corresponding to one of the first openings;

an area of the second opening is less than an area of the first opening, and the orthographic projection of any of the second openings on the light emitting device layer covers the pixel region.

In the display panel of the present invention, the packaging layer further comprises a third insulating layer disposed between the spacer and the color resist; and the third insulating layer is disposed along an inner circle of the first opening.

By setting a packaging layer, a color film layer, and a touch layer on a same layer, the present invention not only reduces a number of photomasks of a display panel, but also reduces a thickness of the display panel, simplifies a manufacturing process, and reduces production costs.

DESCRIPTION OF SPECIFIC EMBODIMENTS OF THE INVENTION

In order to make the purpose, technical solution, and effect of this application clearer and more definite, the following describes this application in detail with reference to the drawings and examples. It should be understood that the specific embodiments described herein are only used to explain the application and are not intended to limit the application.

Current OLED display panels generally need to form a color film layer, a touch layer, etc. on a packaging layer. Processes of the packaging layer and the color film layer require multiple photomasks, and the touch layer can be built-in or plug-in, etc. The above structure and operation complicate processes of OLED display panels, and also increase a thickness of the panels. The present invention provides the following technical solutions based on the above technical problems.

Please refer to FIG. 1 and FIG. 2A to FIG. 2F, a manufacturing method of a display panel 100 comprises following steps:

S10, forming a light emitting device layer 20 on an array substrate 10.

Figure 1:
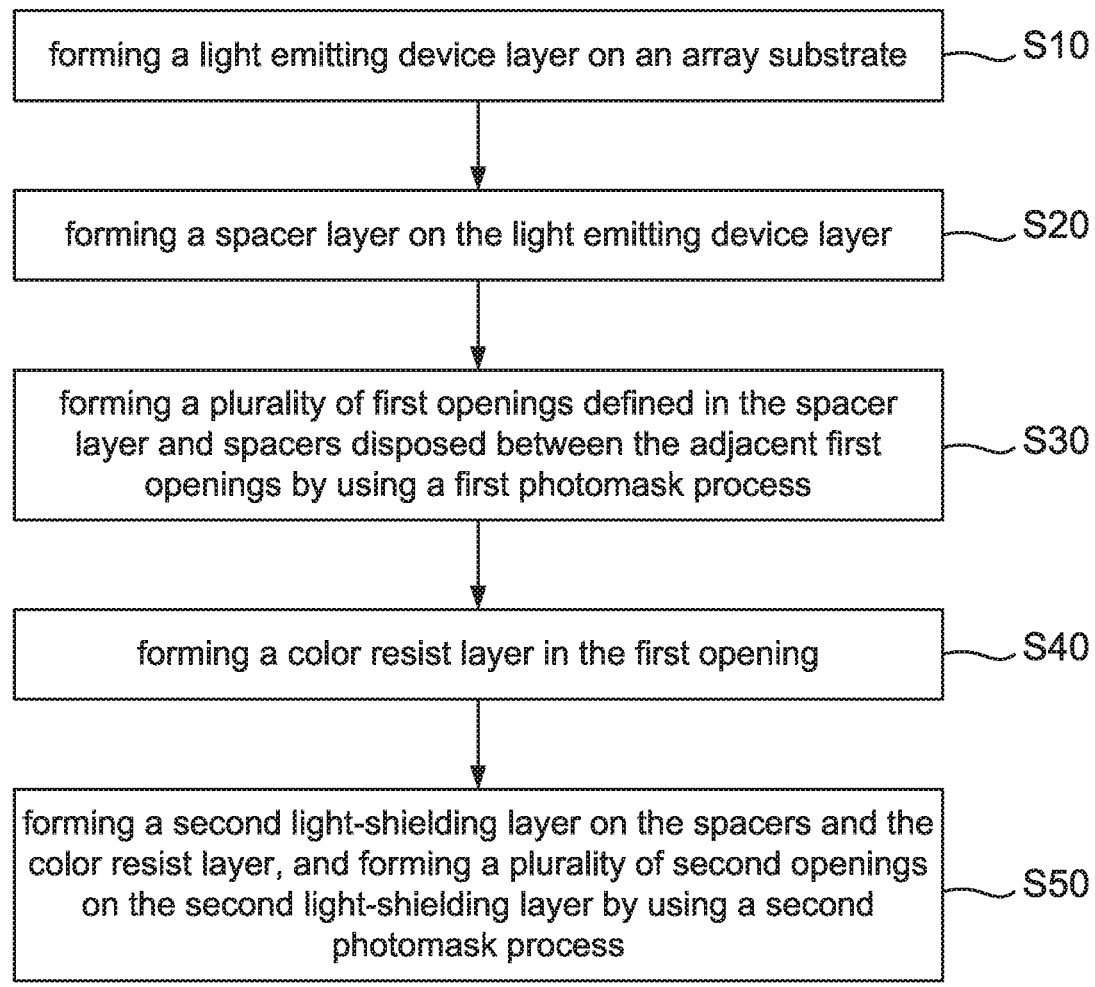
FIG. 1 is a flowchart of a manufacturing method of a display panel of the present invention.
Figure 2A:
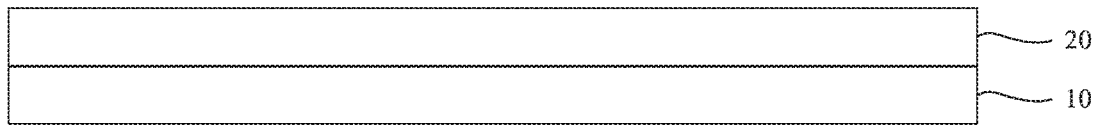
FIG. 2A to FIG. 2F are flow views of the manufacturing method of the display panel of the present invention.

Please refer to FIG. 2A, the array substrate 10 comprises a substrate and a thin film transistor layer disposed on the substrate. The specific structure of the thin film transistor is not specifically limited in the present invention.

The light emitting device layer 20 comprises an anode layer disposed on the array substrate 10, a light emitting layer disposed on the anode layer, and a cathode layer disposed on the light emitting layer. The specific form and specific materials of the above structure are not specifically limited in the present invention.

S20, forming a spacer layer on the light emitting device layer 20.

Figure 2B:
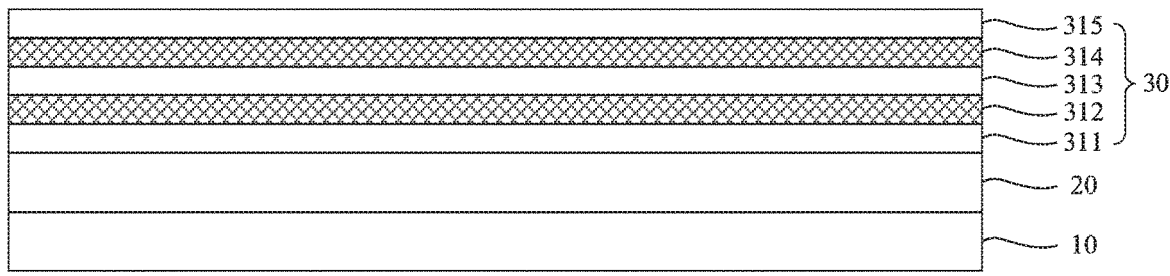

Please refer to FIG. 2B, step S20 specifically comprises:

S201, forming a first insulating layer 311 on the light emitting device layer 20;

S202, forming a first metal layer 312 on the first insulating layer 311;

S203; forming a second insulating layer 313 on the first metal layer 312;

S204, forming a second metal layer 314 on the second insulating layer 313; and

S205, forming a first light-shielding layer 315 on the second metal layer 314.

In this step, materials of the first insulating layer 311 and the second insulating layer 313 may be a compound of a combination of elements such as carbon, silicon, and oxygen, or a mixture of a combination of multiple inorganic substances, and are not specifically limited in the present invention.

In the embodiment, the first insulating layer 311, the first metal layer 312, the second insulating layer 313, and the second metal layer 314 may be provided as a whole layer.

In step S202, it may comprise:

forming the first metal layer 312 on the first insulating layer 311; and making the first metal layer 312 form a plurality of bridge wires disposed between adjacent first openings 301 by using a third photomask process.

Since the second metal layer 314 is a material for forming touch metal wires, and different electrodes need to be insulated, setting of the first metal layer 312 provides the bridge wire for a first electrode or a second electrode.

In the embodiment, a width of the bridge wire is less than a width of a corresponding spacer 310.

Before step S204, the method further comprises following step:

forming a plurality of first via holes on the second insulating layer 313 corresponding to the bridge wires, so that a portion of the bridge wires is exposed.

Figure 2C:
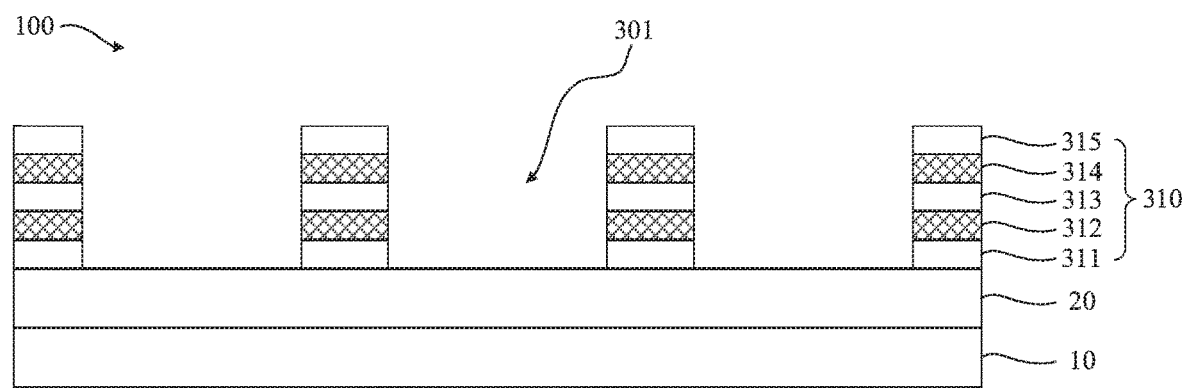

S30, forming a plurality of first openings 301 defined in the spacer layer and spacers 310 disposed between the adjacent first openings 301 by using a first photomask process;

Please refer to FIG. 2C, this step specifically comprises:

S301, forming a first light-shielding pattern by exposing and developing the first light-shielding layer 315; and S302, etching the first insulating layer 311, the first metal layer 312, the second insulating layer 313, and the second metal layer 314 according to the first light-shielding pattern, and making the second metal layer 314 to form a plurality of metal wires 303.

In this step, the first light-shielding layer 315 may be made of a photoresist material.

In the embodiment, the plurality of metal wires 303 constitute a plurality of first electrodes arranged along a first direction X and a plurality of second electrodes arranged along a second direction Y, and the first electrodes and the second electrodes are insulated and criss-cross arranged.

Figure 2D:
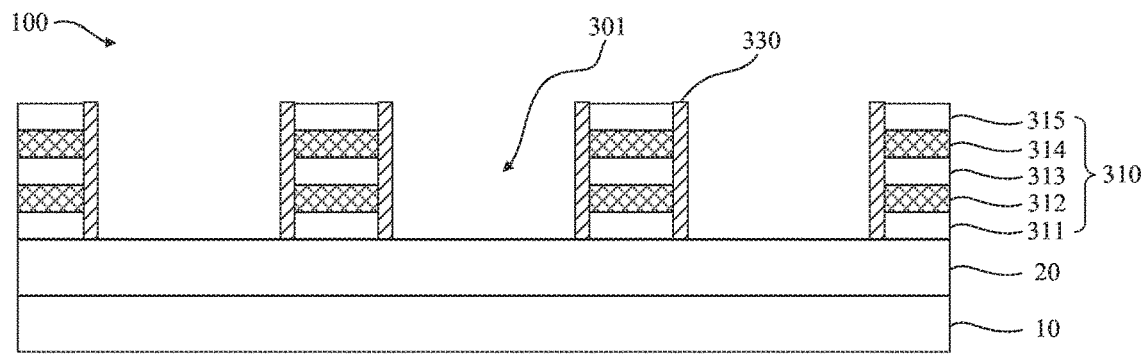

Please refer to FIG. 2D, before a color resist layer is formed in the first opening 301, the method further comprises following step:

forming a third insulating layer 330 on an inner circle of any of the first openings 301.

In the embodiment, the patterned first metal layer 312 may be in contact with a color resist 302. In a working state, the first metal layer 312 will conduct electricity to generate a certain amount of heat. As a material of the color resist 302 is generally an organic material, the generated heat will cause the material of the color resist 302 in contact with the first metal layer 312 to fail. The arrangement of the third insulating layer 330 isolates the contact between the color resist 302 and the first metal layer 312 and prevents the technical problem that the color resist 302 fails due to heat.

S40, forming the color resist layer in the first opening 301, wherein the color resist layer comprises a plurality of color resists 302, and each of the first openings 301 corresponds to one of the color resists 302.

Figure 2E:
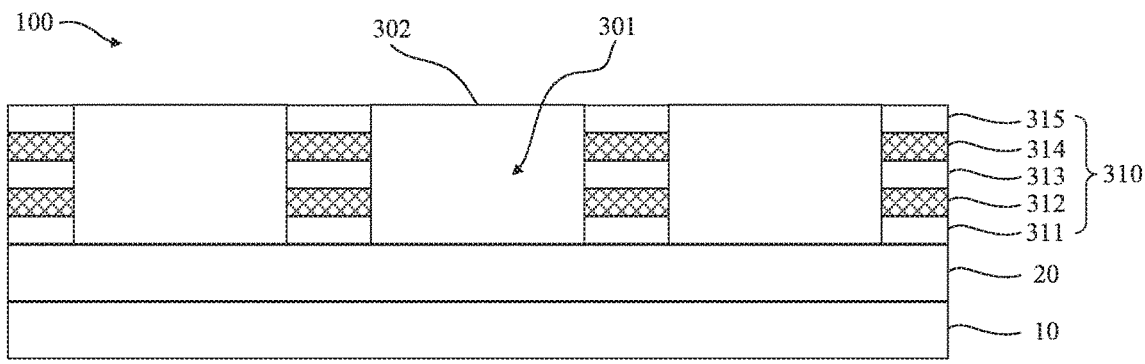
Figure 3:
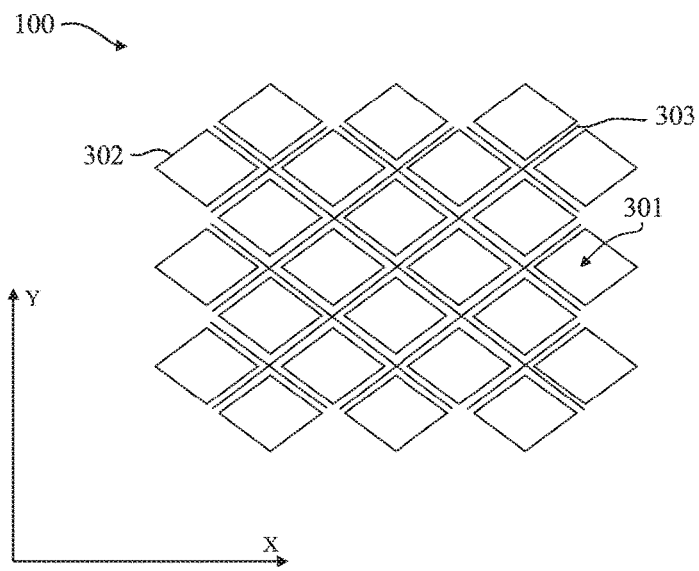
FIG. 3 is a top structural view of the display panel of the present invention.

Please refer to FIG. 2E and FIG. 3, in the present invention, the color resist 302 may be formed in the first opening 301 by using an inkjet printing process.

In the embodiment, a sum of thicknesses of the first insulating layer 311, the first metal layer 312, the second insulating layer 313, the second metal layer 314, and the first light-shielding layer 315 is equal to a thickness of the color resist 302.

In the prior art, the thickness of the color resist 302 in the color resist layer is greater, and adjacent color resists 302 are separated by a black matrix. Meanwhile, a thickness of the black matrix is lesser, resulting in greater undulations between the adjacent color resistors 302. This makes flatness of the display panel 100 poor, and a planarization layer or other organic film layers need to be filled to fill the color resist layer later. In the embodiment, the first opening 301 is provided in a series of film layers, and the color resist 302 is filled in the first opening 301, so that the adjacent color resists 302 and spacers 310 disposed between the adjacent color resists 302 have the same thickness. This ensures flatness of the color resist layer without the need to add a corresponding planarization layer, which simplifies the structure and process.

In the embodiment, in order to ensure that light emitted by a light emitting unit in a pixel region can pass through the color resist 302 to the greatest extent, an area of the color resist 302 set in the present invention is greater than an area of the corresponding light emitting unit. In addition, in order to ensure that resistance of the metal lines forming the first electrode and the second electrode is as low as possible, a distance between adjacent first electrodes or adjacent second electrodes is as short as possible to reduce resistance of the metal wires 303 and improve touch sensitivity of the touch electrode.

S50, forming a second light-shielding layer 320 on the spacers 310 and the color resist layer, and forming a plurality of second openings 321 on the second light-shielding layer 320 by using a second photomask process.

Figure 2F:
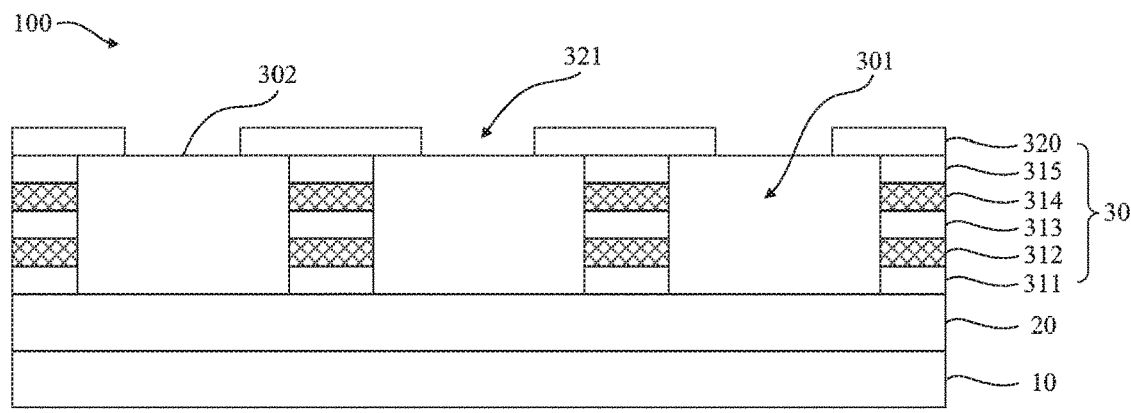

Please refer to FIG. 2F, the second light-shielding layer 320 covers the first light-shielding layer 315 and a portion of the first opening 301. The second light-shielding layer 320 comprises at least a second opening 321, and each of the second openings 321 corresponds to one of the first openings 301.

In the embodiment, an area of the second opening 321 is less than an area of the first opening 301. An orthographic projection of any of the second openings 321 on the light emitting device layer 20 covers the pixel region.

In the embodiment, the second light-shielding layer 320 is formed on the spacer 310 and the color resist 302. The area of the second opening 321 in the second light-shielding layer 320 is less than the area of the first opening 301 and greater than an area of the pixel region, so that the second light shielding layer 320 can adjust light transmittance of the light emitting device layer 20.

In the embodiment, the second light-shielding layer 320 is made of a material with high light absorption. On the premise of ensuring the transmittance of the light emitting device layer 20, external environmental light can also be regulated to a certain extent, and setting of a polarizer can be removed.

Subsequent steps further include setting of a cover layer, etc., and are not described in the present invention.

Please refer to FIG. 3 to FIG. 6. The display panel 100 comprises an array substrate 10, a light emitting device layer 20 disposed on the array substrate 10, and a packaging layer 30 disposed on the light emitting device layer 20.

The packaging layer 30 comprises a plurality of first openings 301 and spacers 310 disposed between the adjacent first openings 301, and any one of the first openings 301 is filled with a color resist 302.

A plurality of metal wires 303 are disposed in the spacers 310. The plurality of metal wires 303 constitute a plurality of first electrodes arranged along a first direction X and a plurality of second electrodes arranged along a second direction Y, and the first electrodes and the second electrodes are insulated and criss-cross arranged.

By setting the packaging layer 30, a color film layer, and a touch layer on a same layer, the present invention not only reduces a number of photomasks of the display panel 100, but also reduces a thickness of the display panel 100, simplifies a manufacturing process, and reduces production costs.

The technical solution of the present invention will be described in combination with specific embodiments.

Embodiment 1

Figure 4:
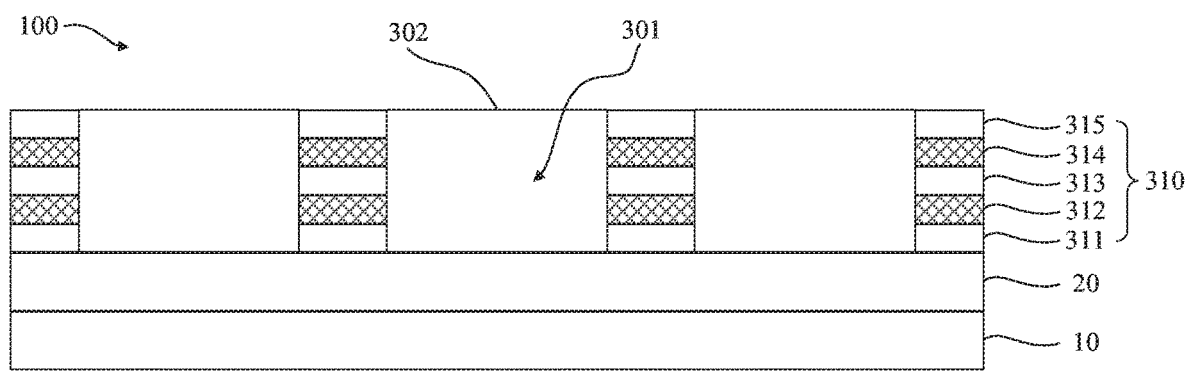
FIG. 4 is a first structural view of the display panel of the present invention.

Please refer to FIG. 4, the spacer 310 comprises a first insulating layer 311 disposed on the light emitting device layer 20, a first metal layer 312 disposed on the first insulating layer 311, a second insulating layer 313 disposed on the first metal layer 312, a second metal layer 314 disposed on the second insulating layer 313, and a first light-shielding layer 315 disposed on the second metal layer 314.

In the embodiment, a sum of thicknesses of the first insulating layer 311, the first metal layer 312, the second insulating layer 313, the second metal layer 314, and the first light-shielding layer 315 is equal to a thickness of the color resist 302.

In the prior art, the thickness of the color resist 302 in the color resist layer is greater, and adjacent color resists 302 are separated by a black matrix. Meanwhile, a thickness of the black matrix is lesser, resulting in larger undulations between adjacent color resistors 302. This makes flatness of the display panel 100 poor, and a planarization layer or other organic film layers need to be filled to fill the color resist layer later. In the embodiment, the first opening 301 is provided in a series of film layers, and the color resist 302 is filled in the first opening 301, so that the adjacent color resists 302 and spacers 310 disposed between the adjacent color resists 302 have the same thickness. This ensures flatness of the color resist layer without the need to add a corresponding planarization layer, which simplifies the structure and process.

Please refer to FIG. 3, a plurality of the metal wires 303 are formed by patterning the second metal layer 314. Two of the adjacent first electrodes disposed along the first direction X or two of the adjacent second electrodes disposed along the second direction Y are electrically connected to the second metal layer 314 through a first via hole.

In the embodiment, the first metal layer 312 comprises a plurality of bridge wires. The bridge wires are disposed between two adjacent color resists 302. For example, a plurality of the first electrodes are disposed along the first direction X, and a plurality of the second electrodes are disposed along the second direction Y. Two adjacent second electrodes in the present invention are electrically connected through the bridge wire.

In the display panel 100 of the present invention, the light emitting device layer 20 comprises a pixel region, and an orthographic projection of any of the color resists 302 on the light emitting device layer 20 covers the pixel region.

In order to ensure that light emitted by a light emitting unit in the pixel region can pass through the color resist 302 to the greatest extent, an area of the color resist 302 set in the present invention is greater than an area of the corresponding light emitting unit. In addition, in order to ensure that resistance of the metal lines forming the first electrode and the second electrode is as low as possible, a distance between adjacent first electrodes or adjacent second electrodes is as short as possible to reduce resistance of the metal wires 303 and improve touch sensitivity of the touch electrode.

By setting the packaging layer 30, a color film layer, and a touch layer on a same layer, the present invention not only reduces a number of photomasks of the display panel 100, but also reduces a thickness of the display panel 100, simplifies a manufacturing process, and reduces production costs.

Embodiment 2

Figure 5:
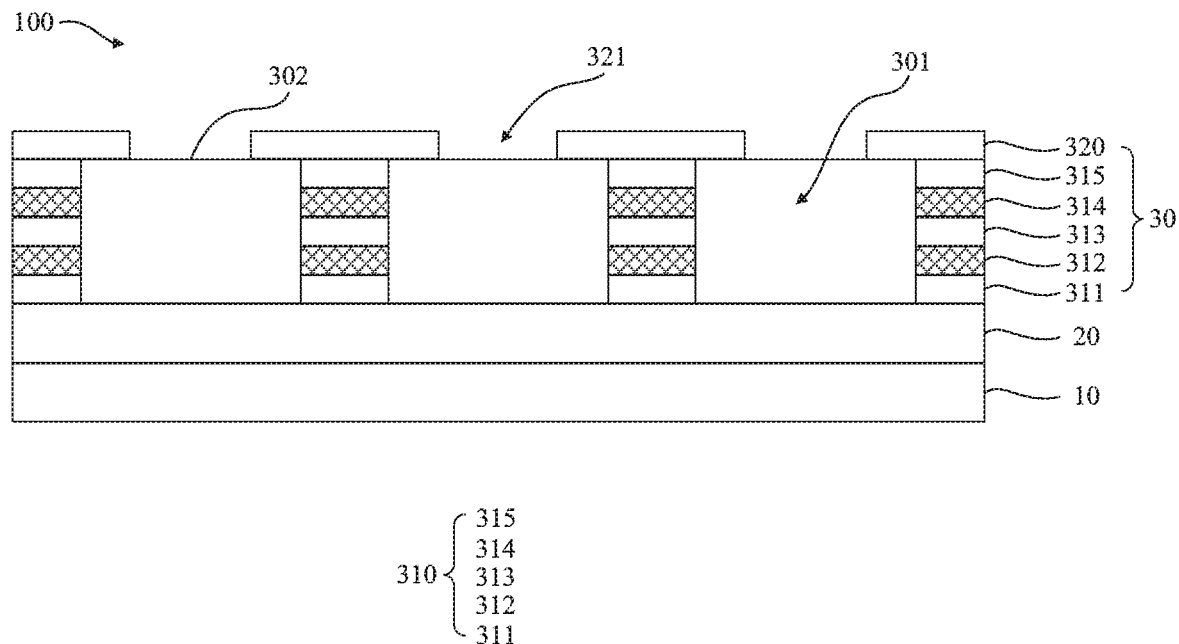
FIG. 5 is a second structural view of the display panel of the present invention.

This embodiment is the same as or similar to Embodiment 1, and the difference is that:

Please refer to FIG. 5, the packaging layer 30 further comprises a second light-shielding layer 320 disposed on the first light-shielding layer 315.

In the embodiment, the second light-shielding layer 320 covers the first light-shielding layer 315 and a portion of the first opening 301. The second light-shielding layer 320 comprises at least a second opening 321, and each of the second openings 321 corresponds to one of the first openings 301.

In the embodiment, an area of the second opening 321 is less than an area of the first opening 301. The orthographic projection of any of the second openings 321 on the light emitting device layer 20 covers the pixel region.

In the embodiment, the second light-shielding layer 320 is formed on the spacer 310 and the color resist 302. The area of the second opening 321 in the second light-shielding layer 320 is less than the area of the first opening 301 and greater than an area of the pixel region, so that the second light shielding layer 320 can adjust light transmittance of the light emitting device layer 20.

In the embodiment, the second light-shielding layer 320 is made of a material with high light absorption. On the premise of ensuring light transmittance of the light emitting device layer 20, external environmental light can also be regulated to a certain extent, and setting of a polarizer can be removed.

Embodiment 3

Figure 6:
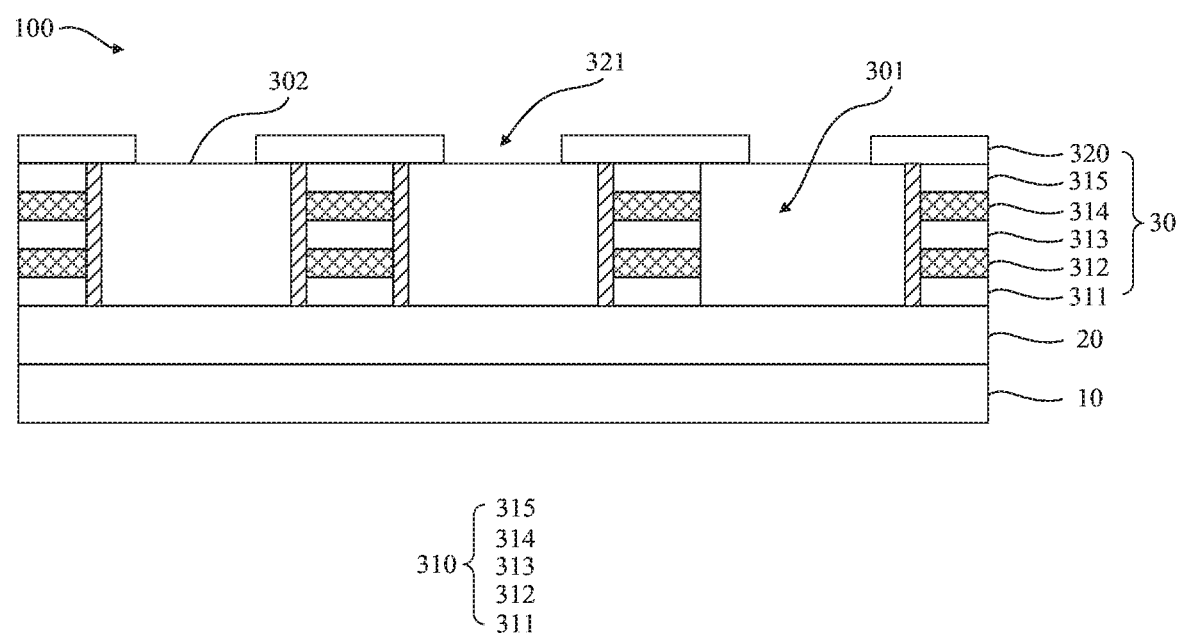
FIG. 6 is a third structural view of the display panel of the present invention.

The embodiment is the same as or similar to Embodiment 1 and Embodiment 2, and the difference is that:

Please refer to FIG. 6, the packaging layer 30 may further comprise a third insulating layer 330 disposed between the spacer 310 and the color resist 302. The third insulating layer 330 is formed on an inner circle of the first openings 301.

In the embodiment, the patterned first metal layer 312 may be in contact with the color resist 302. In a working state, the first metal layer 312 will conduct electricity to generate a certain amount of heat. As a material of the color resist 302 is generally an organic material, the generated heat will cause the material of the color resist 302 in contact with the first metal layer 312 to fail. The arrangement of the third insulating layer 330 isolates the contact between the color resist 302 and the first metal layer 312 and prevents the technical problem that the color resist 302 fails due to heat.

In the above embodiments, the display panel 100 may further comprise a cover layer on the packaging layer 30, and the specific structure is not described in the present invention.

By setting the packaging layer 30, a color film layer, and a touch layer on the same layer, the first insulating layer 311, the second insulating layer 313, and the color resist layer may replace the inorganic layer and the organic layer in the current packaging layer 30. Touch electrodes are disposed between the adjacent color resists 302 through a metal grid, and the current organic layers are replaced by color resists. Thus, the present invention not only simplifies the structure of the panel, but also simplifies the panel manufacturing process.

The present invention further provides a display device, which comprises the above display panel. In the embodiment, the working principle of the display device is the same as or similar to that of the display panel, and is not repeated here.

The present invention provides a display panel and a manufacturing method thereof, and a display device. The display panel comprises an array substrate, a light emitting device layer disposed on the array substrate, and a packaging layer disposed on the light emitting device layer; wherein the packaging layer comprises a plurality of first openings and spacers disposed between the adjacent first openings, and any one of the first openings is filled with a color resist; and wherein a plurality of metal wires are disposed in the spacers, the plurality of metal wires constitute a plurality of first electrodes arranged along a first direction and a plurality of second electrodes arranged along a second direction, and the first electrodes and the second electrodes are insulated and criss-cross arranged. By setting a packaging layer, a color film layer, and a touch layer on the same layer, the present invention not only reduces a number of photomasks of a display panel, but also reduces a thickness of the display panel, simplifies a manufacturing process, and reduces production costs.

It is understandable that various other corresponding changes and modifications can be made according to the technical solutions and technical ideas of the present invention to those skilled in the art, and all such changes and modifications are within the scope of the claims of the present invention.

What is claimed is:

1. A manufacturing method of a display panel, comprising following steps:
    forming a light emitting device layer on an array substrate;
    forming a spacer layer on the light emitting device layer;
    forming a plurality of first openings defined in the spacer layer and spacers disposed between adjacent first openings by using a first photomask process;
    forming a color resist layer in the first openings, wherein the color resist layer comprises a plurality of color resists, and each of the first openings corresponds to one of the color resists; and
    forming a second light-shielding layer on the spacers and the color resist layer, and forming a plurality of second openings on the second light-shielding layer by using a second photomask process;
    wherein an area of the second openings is less than an area of the first openings;
    wherein before the step of forming the color resist layer in the first openings, the manufacturing method further comprises following step:
    forming a first insulating layer on an inner circle of any of the first openings.

2. The manufacturing method of the display panel as claimed in claim 1, wherein the step of forming the spacer layer on the light emitting device layer comprises:
    forming a second insulating layer on the light emitting device layer;
    forming a first metal layer on the second insulating layer;
    forming a third insulating layer on the first metal layer;
    forming a second metal layer on the third insulating layer; and
    forming a first light-shielding layer on the second metal layer.

3. The manufacturing method of the display panel as claimed in claim 2, wherein the step of forming the first metal layer on the second insulating layer comprises:
    forming the first metal layer on the second insulating layer; and
    making the first metal layer form a plurality of bridge wires disposed between the adjacent first openings by using a third photomask process;
    wherein the step of forming the second metal layer on the third insulating layer further comprises:
    forming a plurality of first via holes on the third insulating layer corresponding to the bridge wires, so that a portion of the bridge wires is exposed.

4. The manufacturing method of the display panel as claimed in claim 3, wherein the step of forming the plurality of first openings and the spacers disposed between the adjacent first openings on the spacer layer by using the first photomask process comprises:
    forming a first light-shielding pattern by exposing and developing the first light-shielding layer; and
    etching the second insulating layer, the first metal layer, the third insulating layer, and the second metal layer according to the first light-shielding pattern, and making the second metal layer form a plurality of metal wires;
    wherein the plurality of metal wires constitute a plurality of first electrodes arranged along a first direction and a plurality of second electrodes arranged along a second direction, and the first electrodes and the second electrodes are insulated and criss-cross arranged.

5. The manufacturing method of the display panel as claimed in claim 1, wherein a width of the bridge wire is less than a width of a corresponding spacer.

6. A display panel, comprising:
    an array substrate, a light emitting device layer disposed on the array substrate, and a packaging layer disposed on the light emitting device layer;
    wherein the packaging layer comprises a plurality of first openings and spacers disposed between adjacent first openings, and any one of the first openings is filled with a color resist; and
    wherein a plurality of metal wires are disposed in the spacers, the plurality of metal wires constitute a plurality of first electrodes arranged along a first direction and a plurality of second electrodes arranged along a second direction, and the first electrodes and the second electrodes are insulated and criss-cross arranged;
    wherein the spacers comprise a first insulating layer on the light emitting device layer, a first metal layer on the first insulating layer, a second insulating layer on the first metal layer, a second metal layer on the second insulating layer, and a first light-shielding layer on the second metal layer;
    wherein a sum of thicknesses of the first insulating layer, the first metal layer, the second insulating layer, the second metal layer, and the first light-shielding layer is equal to a thickness of the color resist; and
    wherein two adjacent first electrodes disposed along the first direction or two adjacent second electrodes disposed along the second direction are electrically connected to the second metal layer through a first via hole.

7. The display panel as claimed in claim 6, wherein the light emitting device layer comprises a pixel region, and an orthographic projection of any of the color resists on the light emitting device layer covers the pixel region.

8. The display panel as claimed in claim 7, wherein the packaging layer further comprises a second light shielding layer disposed on the first light shielding layer;
    the second light-shielding layer covers the first light-shielding layer and a portion of the first openings;
    the second light-shielding layer comprises at least one second opening;
    each of the second openings corresponds to one of the first openings;
    an area of the second opening is less than an area of the first opening, and an orthographic projection of any of the second openings on the light emitting device layer covers the pixel region.

9. The display panel as claimed in claim 6, wherein the packaging layer further comprises a third insulating layer disposed between the spacers and the color resist; and
    the third insulating layer is disposed along an inner circle of the first opening.

10. The display panel as claimed in claim 6, further comprising bridge wires disposed between the adjacent first openings;
    wherein a width of the bridge wires is less than a width of a corresponding spacer.

11. A display device, comprising:
    a display panel;

wherein the display panel comprises an array substrate, a light emitting device layer disposed on the array substrate, and a packaging layer disposed on the light emitting device layer;

wherein the packaging layer comprises a plurality of first openings and spacers disposed between adjacent first openings, and any one of the first openings is filled with a color resist; and wherein a plurality of metal wires are disposed in the spacers, the plurality of metal wires constitute a plurality of first electrodes arranged along a first direction and a plurality of second electrodes arranged along a second direction, and the first electrodes and the second electrodes are insulated and criss-cross arranged;

wherein the spacers comprise a first insulating layer on the light emitting device layer, a first metal layer on the first insulating layer, a second insulating layer on the first metal layer, a second metal layer on the second insulating layer, and a first light-shielding layer on the second metal layer;

wherein a sum of thicknesses of the first insulating layer, the first metal layer, the second insulating layer, the second metal layer, and the first light-shielding layer is equal to a thickness of the color resist; and wherein two adjacent first electrodes disposed along the first direction or two adjacent second electrodes disposed along the second direction are electrically connected to the second metal layer through a first via hole.

12. The display device according to claim 11, wherein the light emitting device layer comprises a pixel region, and an orthographic projection of any of the color resists on the light emitting device layer covers the pixel region.

13. The display device according to claim 12, wherein the packaging layer further comprises a second light shielding layer disposed on the first light shielding layer;

the second light-shielding layer covers the first light-shielding layer and a portion of the first openings;

the second light-shielding layer comprises at least one second opening;

each of the second openings corresponds to one of the first openings;

an area of the second opening is less than an area of the first opening, and an orthographic projection of any of the second openings on the light emitting device layer covers the pixel region.

14. The display device according to claim 11, wherein the packaging layer further comprises a third insulating layer disposed between the spacers and the color resist; and wherein the third insulating layer is disposed along an inner circle of the first opening.

15. The display device according to claim 11, wherein the display panel further comprises bridge wires disposed between the adjacent first openings;

wherein a width of the bridge wires is less than a width of a corresponding spacer.

* * * * *